US008758966B2

(12) United States Patent
Cho et al.

(10) Patent No.: US 8,758,966 B2
(45) Date of Patent: Jun. 24, 2014

(54) PHOTOSENSITIVE RESIN COMPOSITION FOR COLOR FILTER AND COLOR FILTER PREPARED USING THE SAME

(75) Inventors: Sang-Won Cho, Uiwang-si (KR); Ji-Hong Kim, Uiwang-si (KR); Seong-Ryong Nam, Uiwang-si (KR); Won-A Noh, Uiwang-si (KR); Taek-Jin Baek, Uiwang-si (KR); Chang-Min Lee, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 58 days.

(21) Appl. No.: 13/609,871

(22) Filed: Sep. 11, 2012

(65) Prior Publication Data

US 2013/0137039 A1 May 30, 2013

(30) Foreign Application Priority Data

Nov. 29, 2011 (KR) ........................ 10-2011-0126316

(51) Int. Cl.
*G03F 7/027* (2006.01)
*G02B 5/20* (2006.01)

(52) U.S. Cl.
USPC ............................................ 430/7; 430/270.1

(58) Field of Classification Search
None
See application file for complete search history.

(56) References Cited

U.S. PATENT DOCUMENTS

| | | | |
|---|---|---|---|
| 5,278,009 A | 1/1994 | Iida et al. | |
| 5,663,019 A | 9/1997 | Matsumura et al. | |
| 5,876,895 A | 3/1999 | Hishiro et al. | |
| 5,998,091 A | 12/1999 | Suzuki | |
| 6,509,125 B1 * | 1/2003 | Ito et al. | 430/7 |
| 6,713,227 B2 | 3/2004 | Machiguchi et al. | |
| 7,087,107 B2 | 8/2006 | Tateishi et al. | |
| 7,931,696 B2 | 4/2011 | Eliu et al. | |
| 2008/0187849 A1 | 8/2008 | Fujita et al. | |
| 2011/0049444 A1 | 3/2011 | Sako et al. | |

FOREIGN PATENT DOCUMENTS

| | | | |
|---|---|---|---|
| EP | 1364994 | A1 | 11/2003 |
| JP | 07-140654 | A | 6/1995 |
| JP | 10-254133 | A | 9/1998 |
| JP | 2002-156751 | A | 5/2002 |
| JP | 2008-268486 | A | 11/2008 |
| JP | 2008-304766 | A | 12/2008 |
| JP | 2010-516880 | A | 5/2010 |
| JP | 2010-191358 | A | 9/2010 |
| KR | 10-1992-7002502 | | 9/1992 |
| KR | 1994-0005617 | B1 | 6/1994 |
| KR | 10-1995-7000359 | | 1/1995 |
| KR | 10-1995-7003746 | | 9/1995 |
| KR | 1995-0011163 | B1 | 9/1995 |
| KR | 10-2002-0002319 | A | 1/2002 |
| KR | 10-2010-0121494 | A | 11/2010 |

* cited by examiner

*Primary Examiner* — John A. McPherson
(74) *Attorney, Agent, or Firm* — Additon, Higgins, Pendleton & Ashe, P.A.

(57) ABSTRACT

Disclosed are a photosensitive resin composition for a color filter that includes a colorant including a phthalocyanine-based compound represented by the following Chemical Formula 1 and a triarylmethane-based compound represented by the following Chemical Formula 2, wherein the substituents of Chemical Formulas 1 and 2 are the same as same as defined in the detailed description, and a color filter prepared using the same.

[Chemical Formula 1]

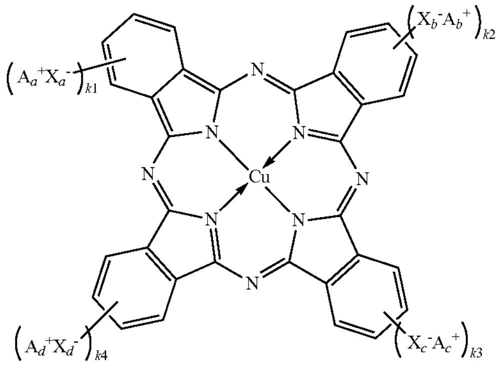

[Chemical Formula 2]

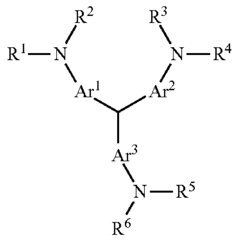

7 Claims, No Drawings

PHOTOSENSITIVE RESIN COMPOSITION FOR COLOR FILTER AND COLOR FILTER PREPARED USING THE SAME

CROSS-REFERENCE TO RELATED APPLICATION

This application claims priority to and the benefit of Korean Patent Application No. 10-2011-0126316 filed in the Korean Intellectual Property Office on Nov. 29, 2011, the entire disclosure of which is incorporated herein by reference.

FIELD

This disclosure relates to a photosensitive resin composition for a color filter and a color filter prepared using the same.

BACKGROUND

Color filters are used for liquid crystal displays (LCDs), optical filters for cameras, and the like. The color filters may be fabricated by coating a fine region with three or more colors on a charge-coupled device or a transparent substrate. This colored thin film can be fabricated using various methods, such as dyeing, printing, electrophoretic deposition (EPD), pigment dispersion, and the like.

The pigment dispersion method forms a colored film by repeating a series of processes such as coating, exposing to a light, developing, and curing a photopolymerizable composition including a coloring agent on a transparent substrate including a black matrix. The pigment dispersion method can improve heat resistance and durability, which are very important characteristics for a color filter, and can provide a film with a uniform thickness.

However, in the pigment dispersion method, the pigment may be not dissolved in a solvent and remain as a dispersion. Accordingly, the pigment particles may reflect, diffract, refract, or otherwise interfer with light during light transmission. As a result, pigment dispersion methods can be limited with regard to improved color characteristics of contrast ratio.

SUMMARY OF THE INVENTION

One embodiment provides a photosensitive resin composition for a color filter that may realize a high aperture ratio and high luminance by improving heat resistance, spectroscopic characteristics and processibility.

Another embodiment provides a color filter prepared using the photosensitive resin composition for a color filter.

According to one embodiment, provided is a photosensitive resin composition for a color filter that includes a colorant including a phthalocyanine-based compound represented by the following Chemical Formula 1 and a triarylmethane-based compound represented by the following Chemical Formula 2.

[Chemical Formula 1]

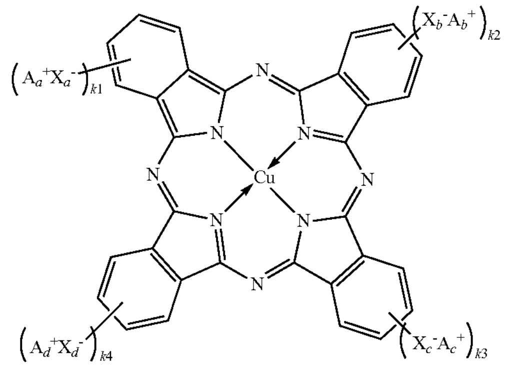

In Chemical Formula 1, $X_a^-$, $X_b^-$, $X_c^-$, and $X_d^-$ are the same or different and are each independently $CO_3$ or $SO_3^-$, $A_a^+$, $A_b^+$, $A_c^+$ and $A_d^+$ are the same or different and are each independently $Na^+$ or a cation represented by the following Chemical Formula A, and k1 to k4 are each independently an integer ranging from 0 to 4, and $1 \leq k1+k2+k3+k4 \leq 16$.

[Chemical Formula A]

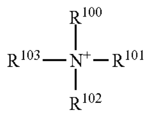

In Chemical Formula A, $R^{100}$ to $R^{103}$ are the same or different and are each independently hydrogen, a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group.

[Chemical Formula 2]

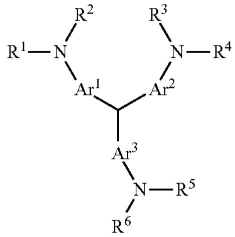

In Chemical Formula 2, $Ar^1$ to $Ar^3$ are the same or different and are each independently a substituted or unsubstituted C6 to C30 aromatic organic group, and $R^1$ to $R^6$ are the same or different and are each independently hydrogen, substituted or unsubstituted C1 to C30 alkyl, substituted or unsubstituted C1 to C30 alkoxy, substituted or unsubstituted C6 to C30 aryl, a functional group represented by the following Chemical Formula 3-1, or a functional group represented by the following Chemical Formula 3-2. In Chemical Formula 2, at least one of $R^1$ to $R^6$ is a functional group represented by the following Chemical Formula 3-1 or a functional group represented by the following Chemical Formula 3-2.

-continued

[Chemical Formula 3-1]

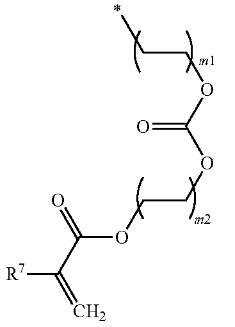

[Chemical Formula 3-2]

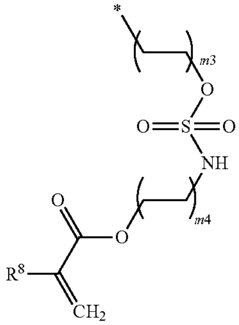

In Chemical Formulas 3-1 and 3-2, m1 to m4 are each independently an integer ranging from 0 to 5, and $R^7$ and $R^8$ are the same or different and are each independently hydrogen or methyl.

The phthalocyanine-based compound may be selected from compounds represented by the following Chemical Formulas 1-1 to 1-4, and combinations thereof.

The triarylmethane-based compound may be selected from compounds represented by the following Chemical Formulas 2-1 to 2-8, and combinations thereof.

[Chemical Formula 1-1]

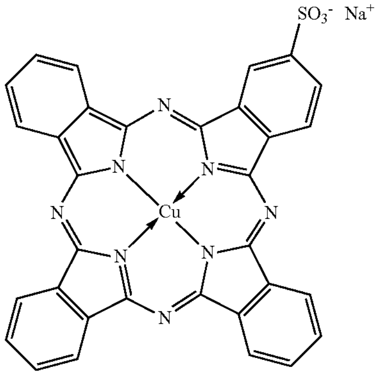

[Chemical Formula 1-2]

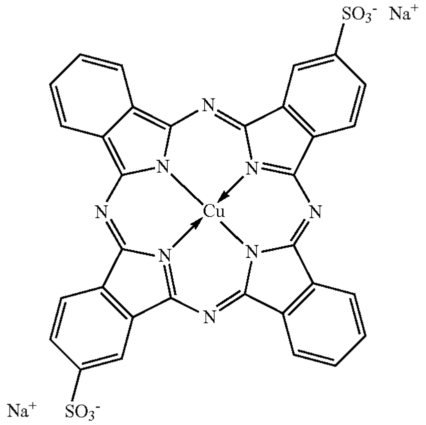

[Chemical Formula 1-3]

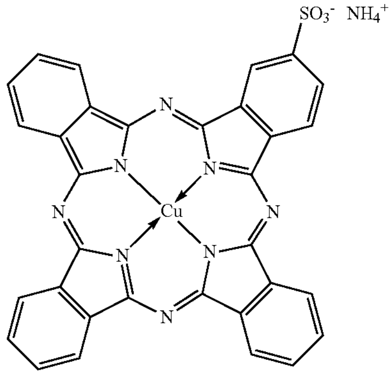

[Chemical Formula 1-4]

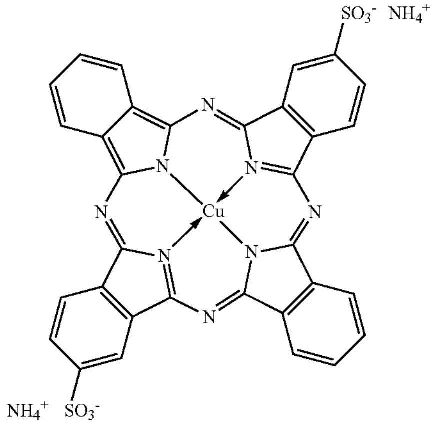

-continued
[Chemical Formula 2-1]
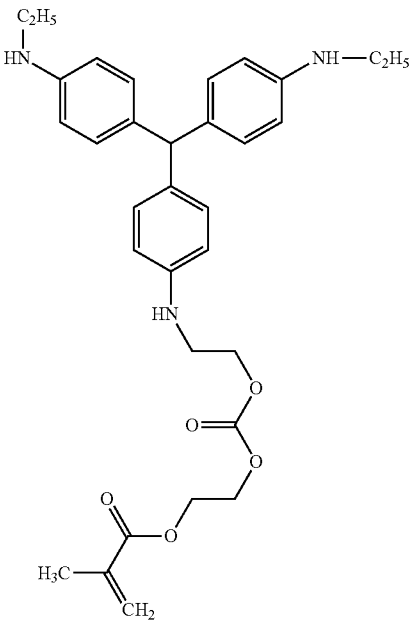
[Chemical Formula 2-2]
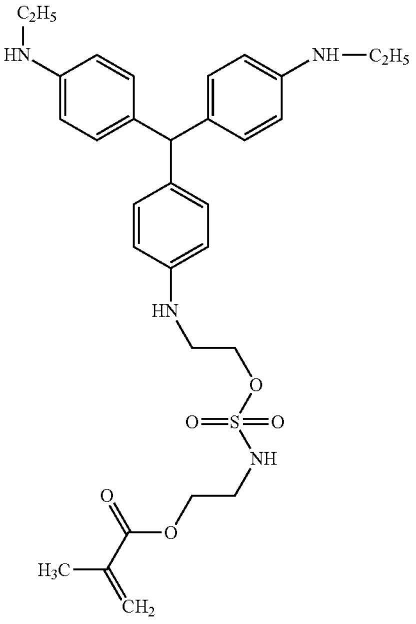
-continued
[Chemical Formula 2-3]
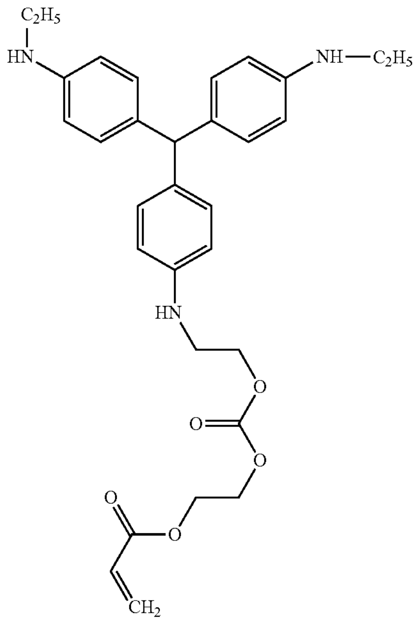
[Chemical Formula 2-4]
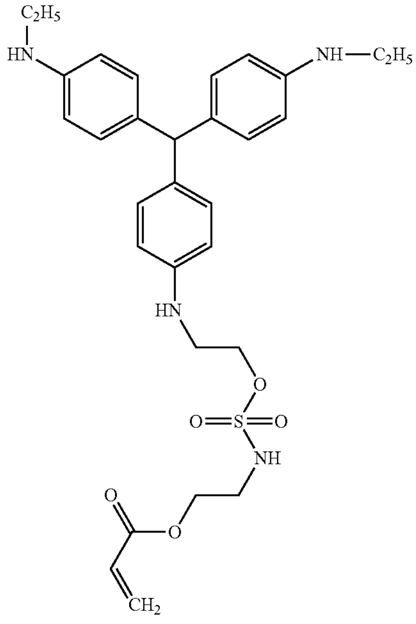

-continued

[Chemical Formula 2-5]

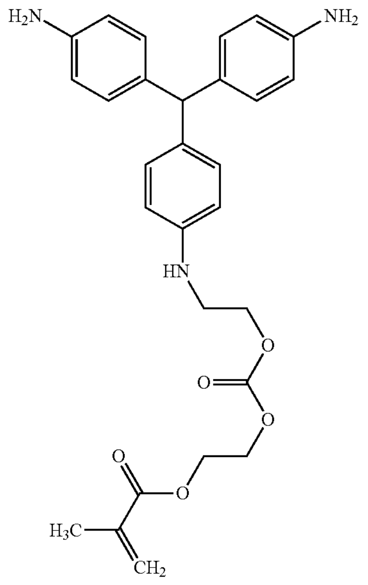

[Chemical Formula 2-6]

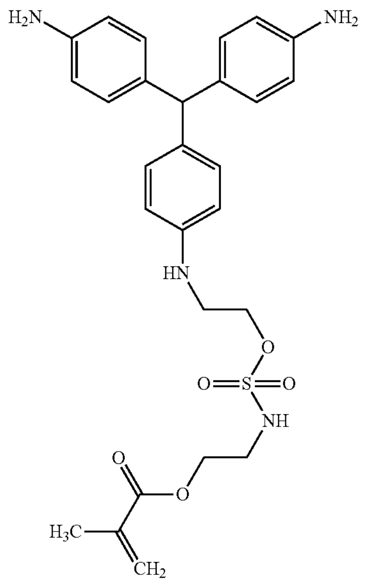

-continued

[Chemical Formula 2-7]

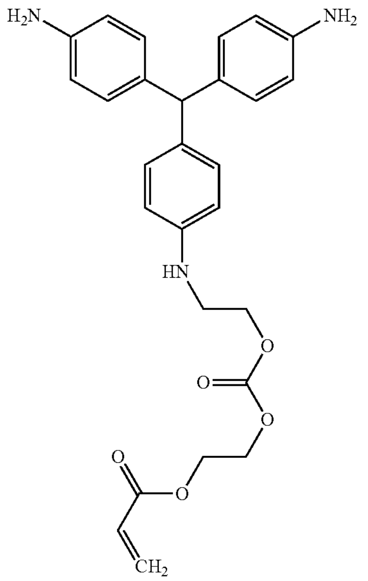

[Chemical Formula 2-8]

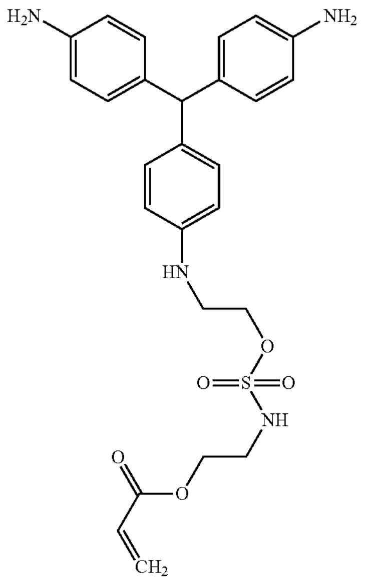

The colorant may include the phthalocyanine-based compound and the triarylmethane-based compound at a weight ratio of about 1:1 to about 1:10.

The photosensitive resin composition for a color filter may further include an alkali soluble resin, a photopolymerizable monomer, a photopolymerization initiator, and a solvent.

The photosensitive resin composition for a color filter may include about 1 to about 40 wt % of the colorant; about 1 to about 30 wt % of the alkali soluble resin; about 1 to about 20 wt % of the photopolymerizable monomer; about 0.01 to about 10 wt % of the photopolymerization initiator; and balance of the solvent.

The photosensitive resin composition for a color filter may further include an additive including malonic acid; 3-amino-1,2-propanediol; a silane-based coupling agent including a vinyl group or a (meth)acryloxy group; a leveling agent; a fluorine-based surfactant; a radical polymerization initiator; or a combination thereof.

A color filter prepared using the photosensitive resin composition for a color filter is also provided.

The photosensitive resin composition for a color filter may realize a high aperture ratio and high luminance with excellent heat resistance, spectroscopic characteristic and processibility.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "substituted" may refer to one substituted with a substituent including halogen (—F, —Cl, —Br, or —I), a hydroxyl group, C1 to C20 alkoxy, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, C1 to C20 alkyl, C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C30 heteroaryl, or a combination thereof, instead of at least one hydrogen in a functional group.

As used herein, when a definition is not otherwise provided, the term "alkyl" may refer to C1 to C30 alkyl, for example C1 to C15 alkyl, the term "cycloalkyl" may refer to C3 to C30 cycloalkyl, for example C3 to C18 cycloalkyl, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, and the term "arylene" may refer to C6 to C30 arylene, for example C6 to C16 arylene.

As used herein, when a definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, a C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" may refer to C6 to C30 aryl or C6 to C30 arylene, for example C6 to C16 aryl or C6 to C16 arylene, the term "heterocyclic group" may refer to C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 heteroatoms including O, S, N, P, Si, or a combination thereof in one ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 heteroatoms including O, S, N, P, Si, or a combination thereof in one ring.

As used herein, when a definition is not otherwise provided, the term "combination" may refer to a mixture or copolymerization. The term "copolymerization" may refer to block copolymerization, random copolymerization, or graft copolymerization, and the term "copolymer" may refer to a block copolymer, a random copolymer, or a graft copolymer.

As used herein, when a definition is not otherwise provided, the term "(meth)acrylate" may refer to "acrylate" and "methacrylate", and "(meth)acrylic acid" may refer to "acrylic acid" and "methacrylic acid."

"*" denotes a position linked to the same or different atom or Chemical Formula.

The photosensitive resin composition for a color filter according to one embodiment includes (A) a colorant, (B) an alkali soluble resin, (C) a photopolymerizable monomer, (D) a photopolymerization initiator, and (E) a solvent.

Hereinafter, each component is described in detail.

(A) Colorant

The colorant includes a phthalocyanine-based compound represented by the following Chemical Formula 1 and a triarylmethane-based compound represented by the following Chemical Formula 2.

[Chemical Formula 1]

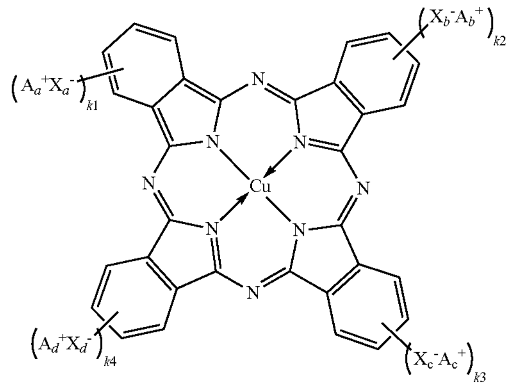

In Chemical Formula 1, $X_a^-$, $X_b^-$, $X_b^-$, and $X_d^-$ are the same or different and are each independently $CO_3^-$, or $SO_3^-$.

$A_a^+$, $A_b^+$, $A_c^+$ and $A_d^+$ are the same or different and are each independently $Na^+$ or a cation represented by the following Chemical Formula A, for example $Na^+$ or $NH_4^+$.

[Chemical Formula A]

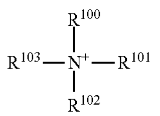

In Chemical Formula A, $R^{100}$ to $R^{103}$ are the same or different and are each independently hydrogen, a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group, for example hydrogen, a substituted or unsubstituted C1 to C20 aliphatic organic group, a substituted or unsubstituted C3 to C20 alicyclic organic group, a substituted or unsubstituted C6 to C20 aromatic organic group, or a substituted or unsubstituted C2 to C20 heterocyclic group, and as another example hydrogen, a substituted or unsubstituted C1 to C10 aliphatic organic group, a substituted or unsubstituted C3 to C10 alicyclic organic group, a substituted or unsubstituted C6 to C10 aromatic organic group, or a substituted or unsubstituted C2 to C10 heterocyclic group.

k1 to k4 are each independently an integer ranging from 0 to 4, $1 \leq k1+k2+k3+k4 \leq 16$, for example k1 to k4 are each independently an integer ranging from 0 to 4, and $1 \leq k1+k2+k3+k42$.

[Chemical Formula 2]

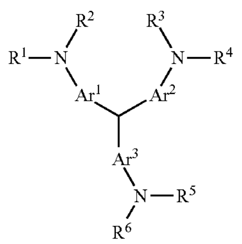

In Chemical Formula 2, $Ar^1$ to $Ar^3$ are the same or different and are each independently a substituted or unsubstituted C6 to C30 aromatic organic group, for example $Ar^1$ to $Ar^3$ are the same or different and are each independently substituted or unsubstituted phenylene, substituted or unsubstituted naphthalenyl, or substituted or unsubstituted anthracenyl.

$R^1$ to $R^6$ are the same or different and are each independently hydrogen, substituted or unsubstituted C1 to C30 alkyl, substituted or unsubstituted C1 to C30 alkoxy, substituted or unsubstituted C6 to C30 aryl, a functional group represented by the following Chemical Formula 3-1 or a functional group represented by the following Chemical Formula 3-2, for example $R^1$ to $R^6$ are the same or different and are each independently hydrogen, substituted or unsubstituted C1 to C10 alkyl, substituted or unsubstituted C1 to C10 alkoxy, substituted or unsubstituted C6 to C15 aryl, a functional group represented by the above Chemical Formula 3-1, or a functional group represented by the above Chemical Formula 3-2. At least one of $R^1$ to $R^6$ is a functional group represented by the following Chemical Formula 3-1 or a functional group represented by the following Chemical Formula 3-2.

[Chemical Formula 3-1]

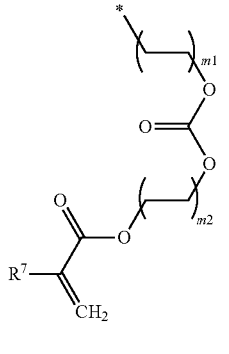

-continued

[Chemical Formula 3-2]

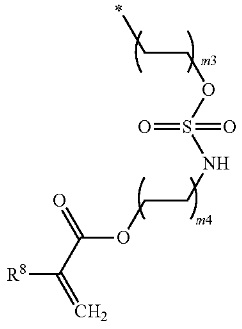

In Chemical Formulas 3-1 and 3-2, m1 to m4 are each independently an integer ranging from 0 to 5, for example m1 to m4 are each independently an integer ranging from 1 to 3, and as another example m1 to m4 are each independently 1.

$R^7$ and $R^8$ are the same or different and are each independently hydrogen or methyl.

The phthalocyanine-based compound represented by the above Chemical Formula 1 can have excellent light transmittance performance, and the triarylmethane-based compound represented by the above Chemical Formula 2 can have excellent solubility, heat resistance, and coloring characteristics in a solvent. The triarylmethane-based compound represented by the above Chemical Formula 2 may improve heat resistance by including a functional group represented by the above Chemical Formula 3-1, a functional group represented by the above Chemical Formula 3-2, or a combination thereof.

Therefore, the colorant including a mixture of the phthalocyanine-based compound represented by the above Chemical Formula 1 and the triarylmethane-based compound represented by the above Chemical Formula 2 may effectively improve light transmittance, heat resistance, solubility to a solvent, processibility, and coloring characteristics.

Therefore, the photosensitive resin composition for a color filter including the colorant may be easily used for manufacturing of a color filter that may realize a high aperture ratio and high luminance.

In one embodiment, the phthalocyanine-based compound may be selected from compounds represented by the following Chemical Formulas 1-1 to 1-4, and combinations thereof, but is not limited thereto.

[Chemical Formula 1-1]

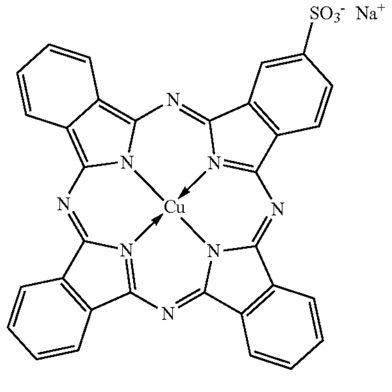

-continued
[Chemical Formula 1-2]
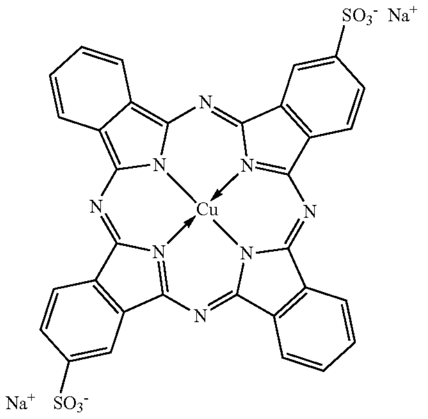
[Chemical Formula 1-3]
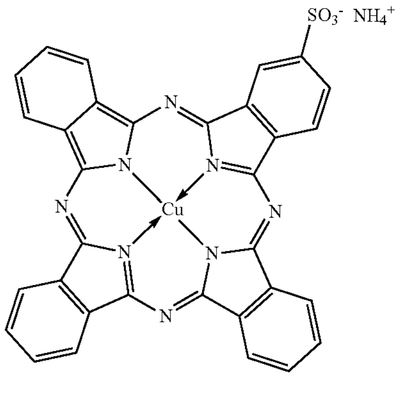
[Chemical Formula 1-4]
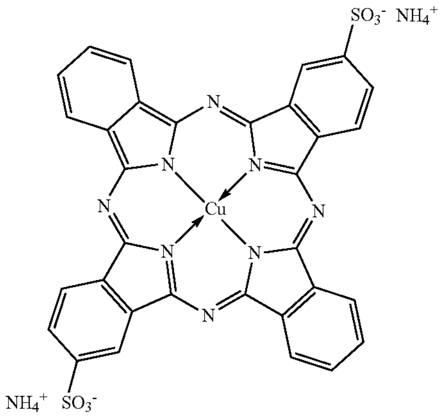
In one embodiment, the triarylmethane-based compound may be selected from compounds represented by the following Chemical Formulas 2-1 to 2-8, and combinations thereof, but is not limited thereto.
[Chemical Formula 2-1]
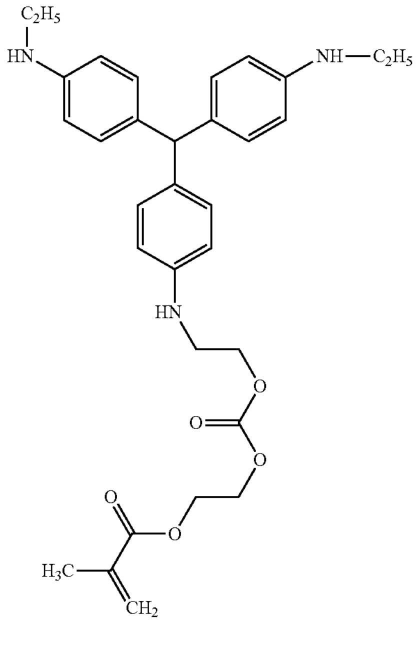
[Chemical Formula 2-2]
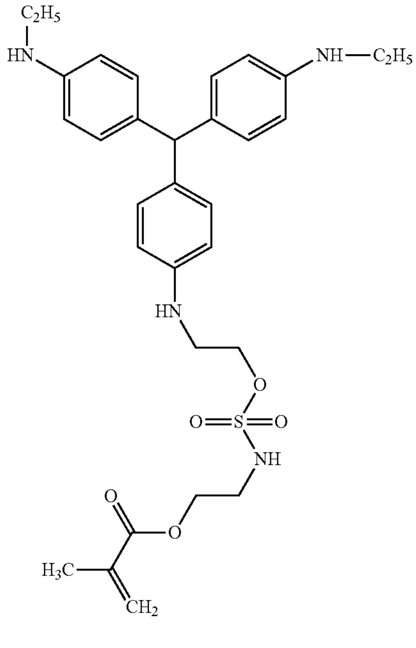

-continued
[Chemical Formula 2-3]
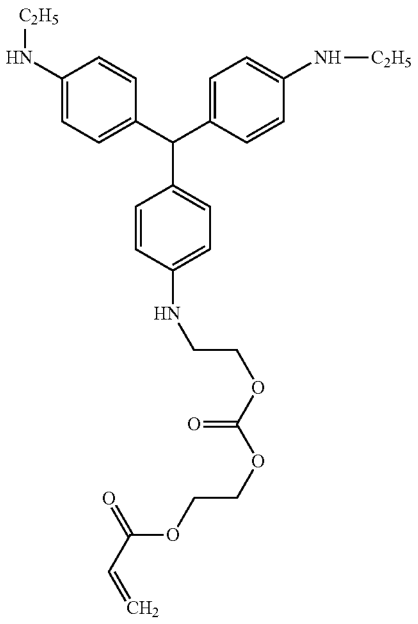
[Chemical Formula 2-4]
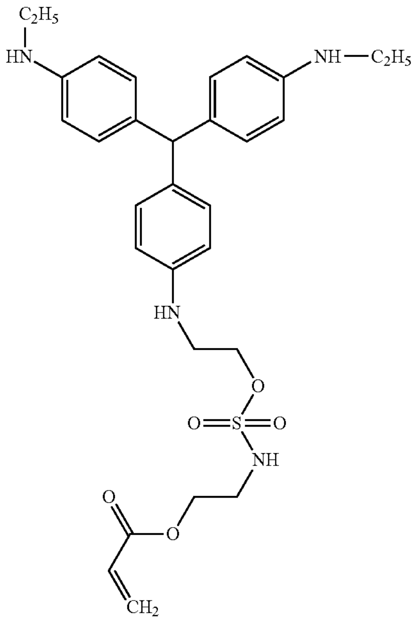
-continued
[Chemical Formula 2-5]
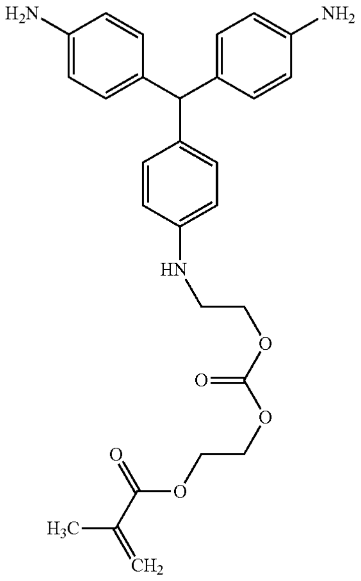
[Chemical Formula 2-6]
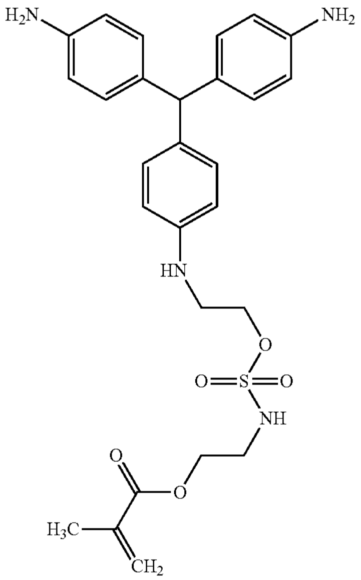

-continued

[Chemical Formula 2-7]

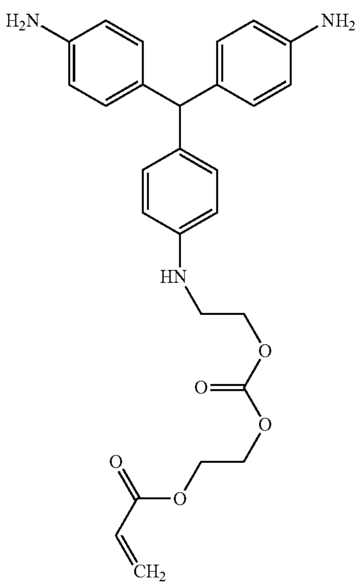

[Chemical Formula 2-8]

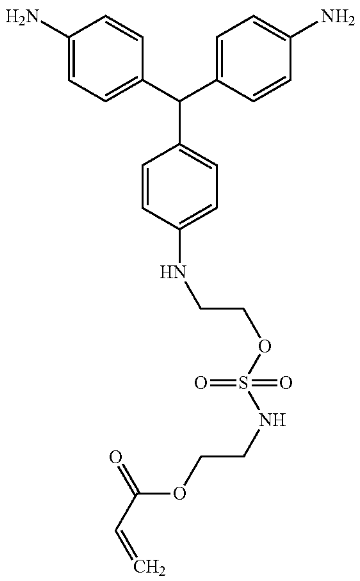

The colorant may include the phthalocyanine-based compound and the triarylmethane-based compound at a weight ratio of about 1:1 to about 1:10. In this case, heat resistance may be effectively improved. In one embodiment, the colorant may include the phthalocyanine-based compound and the triarylmethane-based compound at a weight ratio of about 1:3 to about 1:7.

In some embodiments, the combination of the phthalocyanine-based compound and the triarylmethane-based compound may include the phthalocyanine-based compound in an amount of about 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the phthalocyanine-based compound can be in a range from about any of the foregoing amounts to about any other of the foregoing amounts.

In some embodiments, the combination of the phthalocyanine-based compound and the triarylmethane-based compound may include the triarylmethane-based compound in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, or 91 wt %. Further, according to some embodiments of the present invention, the amount of the triarylmethane-based compound can be in a range from about any of the foregoing amounts to about any other of the foregoing amounts.

The colorant including the phthalocyanine-based compound and the triarylmethane-based compound may emit blue.

The colorant can have excellent solubility in a solvent, and the photosensitive resin composition including the colorant may have excellent luminance and pattern forming property.

The phthalocyanine-based compounds represented by Chemical Formula 1 and the triarylmethane-based compounds represented by Chemical Formula 2 can be synthesized by the skilled artisan without undue experimentation. Suitable starting materials for the synthesis of these compounds can be commercially available and/or can be readily synthesized by the skilled artisan also without undue experimentation.

The photosensitive resin composition may include the colorant in an amount of about 1 to about 40 wt %, for example about 1 to about 30 wt %, and as another example about 1 to about 25 wt %, based on the total amount (weight) of the photosensitive resin composition for a color filter. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the colorant is used in an amount within the above range, high contrast ratio may be shown in the same color coordinates while having excellent color characteristics.

(B) Alkali Soluble Resin

The alkali soluble resin is a copolymer of a first ethylenic unsaturated monomer and a second ethylenic unsaturated monomer that is copolymerizable with the first ethylenic unsaturated monomer, and can include a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like and combinations thereof.

The alkali soluble resin may include the first ethylenic unsaturated monomer in an amount ranging from about 5 to about 50 wt %, for example about 10 to about 40 wt %, based on the total amount (weight) of the alkali soluble resin. In some embodiments, the alkali soluble resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of more than two.

Examples of the alkali soluble resin may include without limitation (meth)acrylic acid/benzyl methacrylate copolymers, (meth)acrylic acid/benzyl methacrylate/styrene copolymers, (meth)acrylic acid/benzyl methacrylate/2-hydroxyethyl methacrylate copolymers, (meth)acrylic acid/benzyl methacrylate/styrene/2-hydroxyethyl methacrylate copolymer, s and the like. They may be used singularly or as a mixture of two or more.

The alkali soluble resin may have a weight average molecular weight ranging from about 3,000 to about 150,000 g/mol, for example about 5,000 to about 50,000 g/mol, and as another example about 2,000 to about 30,000 g/mol. When the alkali soluble resin has a weight average molecular weight within the above range, the photosensitive resin composition for a color filter can have improved physical and chemical properties and suitable viscosity resulting in improvement of close contacting (adhesion) properties with a substrate.

The alkali soluble resin may have an acid value ranging from about 15 to about 60 mgKOH/g, for example about 20 to about 50 mgKOH/g. When alkali soluble resin has an acid value within the above range, excellent pixel resolution may be realized.

The photosensitive resin composition may include the alkali soluble resin in an amount of about 1 to about 30 wt %, for example about 5 to about 20 wt %, based on the total amount (weight) of photosensitive resin composition for a color filter. In some embodiments, the photosensitive resin composition may include the alkali soluble resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 3020, 21, 22, 23, 24, 25, 26, 27, 28, 29, or 30 wt %. Further, according to some embodiments of the present invention, the amount of the alkali soluble resin can be in a range from about any of the foregoing amounts to about any other of the foregoing amounts.

When the alkali soluble resin is included in an amount within the above range, improved developability may be provided during manufacture of a color filter, and the cross-linking property can be improved to obtain excellent smooth surface properties.

(C) Photopolymerizable Monomer

The photopolymerizable monomer may be mono-functional or multi-functional ester of (meth)acrylic acid including at least one ethylenic unsaturated double bond.

The photopolymerizable monomer causes sufficient polymerization during exposure during pattern forming processes to form patterns having excellent heat resistance, light resistance, and chemical resistance, due to the ethylenic unsaturated double bond.

Examples of the photopolymerizable monomer include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa (meth)acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like, and combinations thereof.

Commercially available examples of the photopolymerizable monomer are as follows. The mono-functional (meth) acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of a difunctional (meth)acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The photopolymerizable monomer may be used singularly or as a mixture of two or more.

The photopolymerizable monomer may be treated with acid anhydride to improve developability.

The photosensitive resin composition may include the photopolymerizable monomer in an amount ranging from about 1 to about 20 wt %, for example about 1 to about 20 wt %, and as another example about 5 to about 10 wt %, based on the total amount (weight) of the photosensitive resin composition for a color filter. In some embodiments, the photosensitive resin composition may include the photopolymerizable monomer in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable monomer can be in a range from about any of the foregoing amounts to about any other of the foregoing amounts.

When the photopolymerizable monomer is present in an amount within the above range, curing during exposure during pattern forming processes can be sufficiently performed, and alkali development property can be excellent.

(D) Photopolymerization Initiator

Examples of the photopolymerization initiator may include without limitation acetophenone-based compounds, benzophenone-based compound, thioxanthone-based compounds, benzoin-based compounds, triazine-based compounds, oxime-based compounds, and the like, and combinations thereof.

Examples of the acetophenone-based compound may include without limitation-2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-

2-morpholinopropan-1-one, 2-benzyl-2-dimethylamino-1-(4-morpholinophenyl)-butan-1-one, and the like, and combinations thereof.

Examples of the benzophenone-based compound may include without limitationbenzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound includes thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound includes benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis (trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

Examples of the oxime-based compound may include without limitation2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

Other examples of the photopolymerization initiator may include without limitation carbazole-based compounds, diketone-based compounds, sulfonium borate-based compounds, diazo-based compounds, imidazole-based compounds, biimidazole-based compounds, and the like, and combinations thereof.

The photosensitive resin composition may include the photopolymerization initiator in an amount of about 0.01 to about 10 wt %, for example about 0.1 to about 10 wt %, and as another example about 0.5 to about 5 wt %, based on the total amount (weight) of the photosensitive resin composition for a color filter. In some embodiments, the photosensitive resin composition may include the photopolymerizable initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerizable initiator can be in a range from about any of the foregoing amounts to about any other of the foregoing amounts.

When the photopolymerization initiator is present in an amount within the above range, sufficient curing can be performed during exposure during pattern forming process with minimal or no deterioration of transmittance due to unreacted initiators.

(E) Solvent

The solvent has compatibility with the dye, pigment, alkali soluble resin, photopolymerizable monomer, and photopolymerization initiator but does not have a reaction therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbon such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactic acid alkyl esters such as methyl lactate, ethyl lactate, and the like; hydroxyacetic acid alkyl esters esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate; ketonic acid esters such as ethyl pyruvate; and the like, and combinations thereof. Furthermore, the solvent may be N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or in a combination.

In one embodiment, taking into account miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof may be used.

The photosensitive resin composition includes the solvent in a balance amount, for example about 20 to about 90 wt % based on the total amount (weight) of the photosensitive resin composition for a color filter. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is present in an amount within the above range, a photosensitive resin composition may be easily coated onto a substrate and a film formed of the same having a thickness of 3 μm or more can have excellent smoothness (flatness).

(F) Other Additive(s)

The photosensitive resin composition for a color filter may further include one or more additives. Examples of the additives can include without limitation malonic acid; 3-amino-1,2-propanediol; silane-based coupling agents including a vinyl group or a (meth)acryloxy group; leveling agents; fluorine-based surfactants; and radical polymerization initiators to prevent stains, improve leveling performance, and also prevent residues from being generated due to undevelopment.

Examples of the silane-based coupling agent may include without limitation trimethoxysilyl benzoate, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like, and may be used singularly or as a mixture of two or more.

Examples of the fluorine-based surfactant may include without limitation BM-1000®, and BM-1100® (BM Chemie Inc.); MEGAFACE F 142D®, F 172®, F 173®, and F 183® DAINIPPON INK KAGAKU KOGYO CO., LTD.); FULORAD FC-135®, FULORAD FC-170C®, FULORAD FC-430®, and FULORAD FC-431® (SUMITOMO 3M CO., LTD.); SURFLON S-112®, SURFLON S-113®, SURFLON S-131®, SURFLON S-141®, and SURFLON S-145° (ASAHI GLASS CO., LTD.); and SH-28PA®, SH-190®, SH-193®, SZ-6032®, and SF-8428®, and the like (TORAY SILICONE CO., LTD.), and the like, and combinations thereof.

These additives may be included in an adjusted amount depending on desired properties.

The photosensitive resin composition may further include an epoxy compound in order to improve close contacting (adhesion) properties with a substrate.

Examples of the epoxy compound include without limitation phenol novolac epoxy compounds, tetramethyl biphenyl epoxy compounds, bisphenol A epoxy compounds, alicyclic epoxy compounds, and the like, and combinations thereof.

The photosensitive resin composition may include the epoxy compound in an amount of about 0.01 to about 5 parts by weight, for example about 0.1 to about 5 parts by weight, based on about 100 parts by weight of the photosensitive resin composition for a color filter. In some embodiments, the photosensitive resin composition may include the epoxy compound in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 parts by weight. Further, according to some embodiments of the present invention, the amount of the epoxy compound can be in a range from about any of the foregoing amounts to about any other of the foregoing amounts.

When the epoxy compound is present in an amount within the above range, close contacting properties, heat resistance, and chemical resistance may be improved.

According to another embodiment, a color filter prepared using the photosensitive resin composition is provided. The color filter can be prepared as follows.

The photosensitive resin composition can coated to be about 3.2 to about 3.5 μm thick on a bare glass substrate having about 500 Å to about 1500 Å thick $SiN_X$ (protective layer) thereon by methods such as spin coating, slit coating, and the like. After the coating step, the film can be radiated by light to form a pattern required for a color filter. When the coating layer is treated with an alkali development solution to dissolve the non-radiated part, a pattern for a color filter is formed. This process can be repeated as many times as needed in accordance with the numbers of colors of R, G, B and a light blocking layer, to provide a color filter with a desired pattern.

In this process, the developed image pattern can be further heated or cured by actinic rays to improve crack resistance, solvent resistance, and the like.

EXAMPLES

The following examples illustrate the present invention in more detail. However, it is understood that the present invention is not limited by these examples.

Preparation Example 1

Preparation of Colorant

<Synthesis of phthalocyanine-based compound (Chemical Formula 1-1)>

A solution is prepared by mixing about 128 g of cyanoguanidine, about 256 g of 4-sulfophthalic acid, about 24 g of copper chloride, and about 360 g of urea in a reactor, and the solution is agitated at a temperature of about 180° C. to about 220° C. for about 6 hours.

Subsequently, the temperature of the solution is decreased to about 0° C. to about 10° C., and 2M sodium hydroxide aqueous solution is added to the solution to control the pH of the solution to a pH of about 12, and then the temperature is increased to about 80° C. and the solution is agitated for about 3 hours.

Subsequently, the solution is precipitated and filtrated with 25 wt % sodium chloride aqueous solution, and then the filtrated compound is cleaned with methanol and distilled water and filtrated.

Subsequently, about 24.6 g of a compound represented by the following Chemical Formula 1-1 is obtained by drying it in a drying oven set to about 70° C.

[Chemical Formula 1-1]

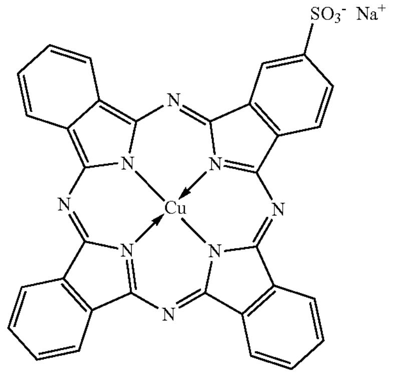

<Synthesis of Triarylmethane-Based Compound (Chemical Formula 2-1)>

A solution is prepared by mixing about 25 g of pararosaniline hydrochloride and about 500 g of ethanol in a reactor, and the solution is agitated at a temperature of about 200° C. for about 8 hours.

Subsequently, the temperature of the solution is decreased to room temperature of about 25° C., and about 174 g of 2-methyl-2-propenoic-carboxyoxy ethyl ester is slowly dripped to the solution for about 5 hours. Subsequently, the temperature of the solution is increased to about 70° C. and then agitated for about 24 hours.

After the reaction is completed, about 54.5 g of a compound represented by the following Chemical Formula 2-1 is obtained by slowly recrystallizing the solution in ethanol.

[Chemical Formula 2-1]

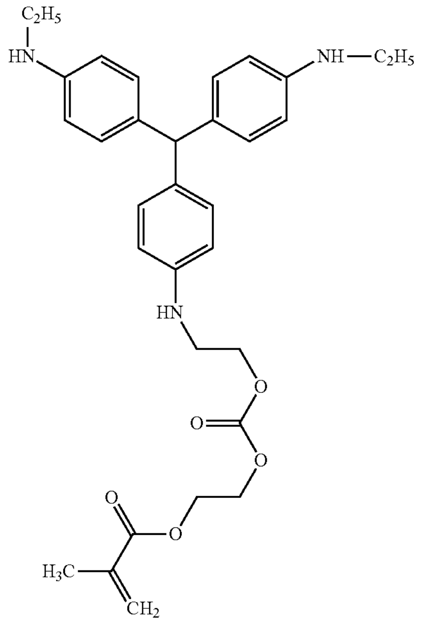

A colorant including a mixture of a compound represented by the above Chemical Formula 1-1 and a compound represented by the above Chemical Formula 2-1 at a weight ratio of about 1:3 is prepared.

Preparation Example 2

Preparation of Colorant

<Synthesis of Phthalocyanine-Based Compound (Chemical Formula 1-1)>

A compound represented by the above Chemical Formula 1-1 is prepared according to the same method as Preparation Example 1.

<Synthesis of Triarylmethane-Based Compound (Chemical Formula 2-2)>

A solution is prepared by mixing about 25 g of pararosaniline hydrochloride and about 500 g of ethanol in a reactor, and the solution is agitated at a temperature of about 200° C. for about 8 hours.

Subsequently, the temperature is decreased to a room temperature of about 25° C., and about 209 g of 2-methyl-2-propenoic-sulfamino ethyl ester is slowly dripped to the solution for about 5 hours. Subsequently, the temperature of the solution is increased to about 70° C. and agitated for about 24 hours.

After the reaction is completed, about 58.2 g of a compound represented by the following Chemical Formula 2-2 is recovered by slowly recrystallizing the solution in ethanol.

[Chemical Formula 2-2]

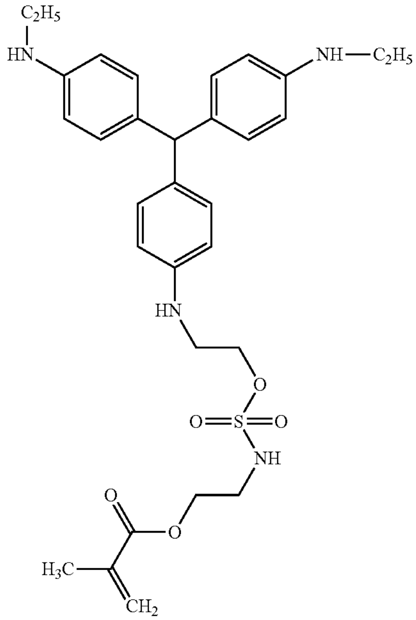

A colorant is prepared by mixing a compound represented by the above Chemical Formula 1-1 and a compound represented by the above Chemical Formula 2-2 at a weight ratio of about 1:3.

Example 1, Example 2, Comparative Example 1 and Comparative Example 2

Preparation of Photosensitive Resin Composition for a Color Filter

Photosensitive resin compositions for a color filter according to Examples 1 and 2 and Comparative Examples 1 and 2 are prepared by using the components described below and the amounts shown in the following Table 1.

A photopolymerization initiator is dissolved in a solvent and agitated for 2 hours at room temperature, and then a photopolymerizable monomer and an alkali soluble resin are added to the mixed solution and agitated at room temperature for about 2 hours. Subsequently, a colorant is added to the acquired reactant and agitated at room temperature for about 1 hour. Subsequently, a photosensitive resin composition for a color filter is prepared by filtrating the product once and removing an impurity.

(A) Colorant (A-1) The colorant prepared according to Preparation Example 1 is used.

(A-2) The colorant prepared according to Preparation Example 2 is used.

(A-3) Solvent Blue 38 (manufactured by Orient Corp., Valifast blue 1605) represented by the following Chemical Formula 1-4 is used as a colorant.

[Chemical Formula 1-4]

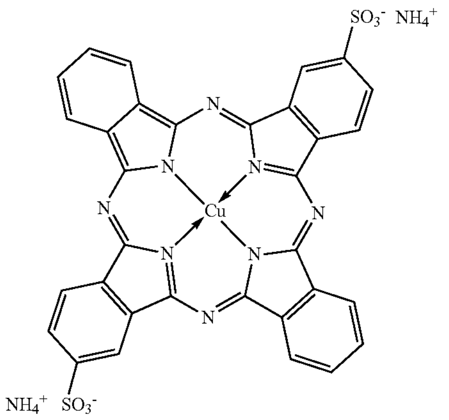

(A-4) Solvent Blue 129 (manufactured by Sunbelt Corp., Morfast blue 100) represented by the following Chemical Formula 4 is used as a colorant.

[Chemical Formula 4]

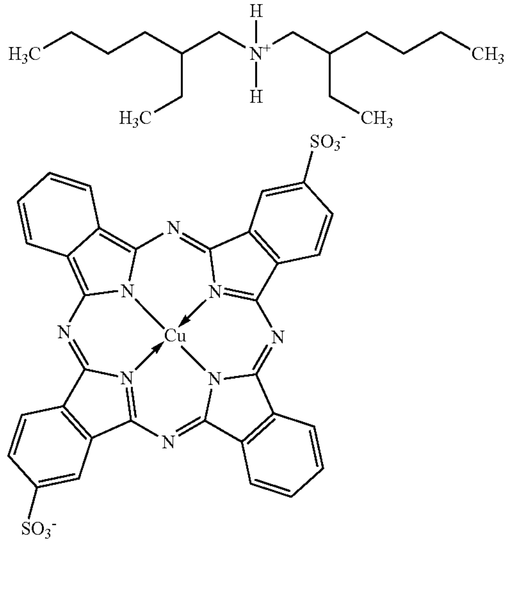

-continued

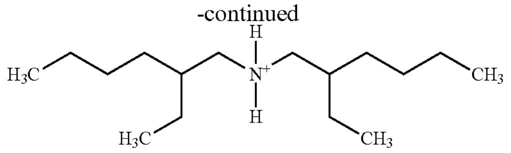

(B) Alkali Soluble Resin

Methacrylic acid/benzyl methacrylate copolymer (weight ratio=15/85, weight average molecular weight=22,000 g/mol, manufactured by DIC, LC20160) is used.

(C) Photopolymerizable Monomer

Dipentaerythritol hexaacrylate (DPHA) is used.

(D) Photopolymerization Initiator

CGI-124 manufactured by Ciba Specialty Chemical Co., Ltd. is used.

(E) Solvent

Propyleneglycol monomethyl ether acetate (PGMEA) is used.

TABLE 1

| | | Examples | | Comparative Examples | |
|---|---|---|---|---|---|
| | | 1 | 2 | 1 | 2 |
| (A) Colorant | A-1 | 1 | — | — | — |
| | A-2 | — | 1 | — | — |
| | A-3 | — | — | 3 | — |
| | A-4 | — | — | — | 5 |
| (B) Alkali soluble resin | | 3.5 | 3.5 | 3.5 | 3.5 |
| (C) Photopolymerizable monomer | | 8.0 | 8.0 | 8.0 | 8.0 |
| (D) Photopolymerization initiator | | 1.5 | 1.5 | 1.5 | 1.5 |
| (E) Solvent | | 86 | 86 | 84 | 82 |

(unit: wt %)

Experimental Example 1

Evaluation of Heat Resistance

The heat resistance of color filters manufactured using the photosensitive resin compositions for a color filter of Examples 1 and 2 and Comparative Examples 1 and 2 are evaluated as described below and the results are shown in the following Table 2.

A bare glass substrate is coated with each of the photosensitive resin compositions for a color filter of Examples 1 and 2 and Comparative Examples 1 and 2 by using a spin coater to a thickness of about 3.2 μm to about 3.5 μm. The coated substrates are soft-baked using a hot plate at about 90° C. for about 150 seconds. Subsequently, the coated glass substrates are exposed using a mask aligner with a power of about 80 mJ, developed using a developer for a development time of about 60 seconds, cleaned for about 60 seconds, and spin-dried for about 25 seconds. As refereneced herein, development is performed using 1% concentration potassium hydroxide development solution at about 25° C. Subsequently, the coated substrates are hard-baked in an oven set to about 230° C. for about 30 minutes. The color change of the specimen obtained from the hard-baking is measured using a colorimeter, and the value of ΔEab* is obtained based on the difference between the color values before and after the treatment. Also, the coated substrates are furtherl baked twice, and then the color change of each specimen is measured using the colorimeter, and the value of ΔEab* is obtained based on the difference between the color values before and after the treatment.

As the value of ΔEab* decreases, heat resistance is excellent. Therefore, heat resistance may be evaluated based on the value of ΔEab*.

<Heat Resistance Evaluation Reference>

Excellent: ΔEab*≤3.0

Poor: ΔEab*>3.0

TABLE 2

| | Heat resistance | |
|---|---|---|
| | Baking (once) | Baking (three times) |
| Example 1 | Good | Good |
| Example 2 | Good | Good |
| Comparative Example 1 | Bad | Bad |
| Comparative Example 2 | Bad | Bad |

As seen from Table 2 the photosensitive resin compositions for a color filter of Examples 1 and 2 have excellent heat resistance.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising:

a colorant comprising phthalocyanine-based compound represented by the following Chemical Formula 1 and triarylmethane-based compound represented by the following Chemical Formula 2:

[Chemical Formula 1]

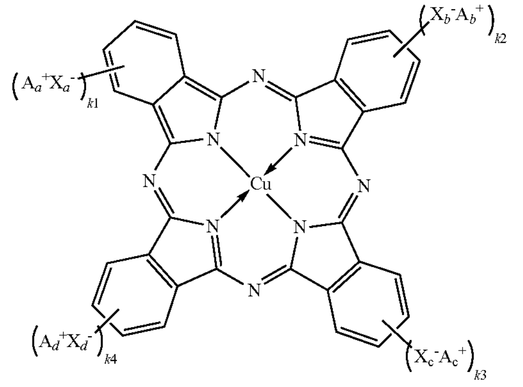

wherein, in Chemical Formula 1, $X_a^-$, $X_b^-$, $X_c^-$ and $X_d^-$ are the same or different and are each independently $CO_3^-$ or $SO_3^-$, $A_a^+$, $A_b^+$, $A_c^+$ and $A_d^+$ are the same or different and are each independently $Na^+$ or a cation represented by the following Chemical Formula A, and k1 to k4 are the same or different and are each independently an integer ranging from 0 to 4, and 1≤k1+k2+k3+k4≤16,

[Chemical Formula A]

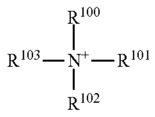

wherein, in Chemical Formula A, $R^{100}$ to $R^{103}$ are the same or different and are each independently hydrogen, a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group,

[Chemical Formula 2]

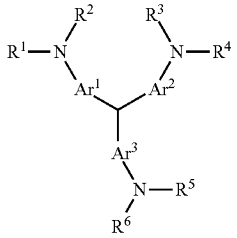

wherein, in Chemical Formula 2, $Ar^1$ to $Ar^a$ are the same or different and are each independently a substituted or unsubstituted C6 to C30 aromatic organic group, and $R^1$ to $R^6$ are the same or different and are each independently hydrogen, substituted or unsubstituted C1 to C30 alkyl, substituted or unsubstituted C1 to C30 alkoxy, substituted or unsubstituted C6 to C30 aryl, a functional group represented by the following Chemical Formula 3-1, or a functional group represented by the following Chemical Formula 3-2, and wherein at least one of $R^1$ to $R^6$ is a functional group represented by the following Chemical Formula 3-1 or a functional group represented by the following Chemical Formula 3-2,

[Chemical Formula 3-1]

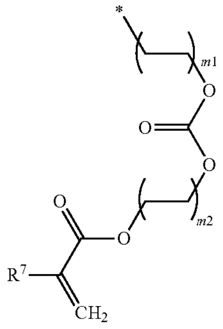

-continued

[Chemical Formula 3-2]

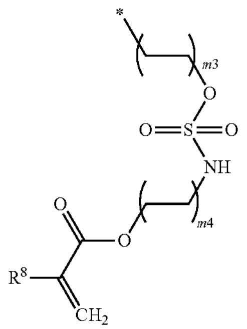

wherein, in Chemical Formulas 3-1 and 3-2, m1 to m4 are the same or different and are each independently an integer ranging from 0 to 5, and $R^7$ and $R^8$ are the same or different and are each independently hydrogen or methyl.

2. The photosensitive resin composition for a color filter of claim 1, wherein the phthalocyanine-based compound includes a compound represented by one of the following Chemical Formulas 1-1 to 1-4, or a combination thereof, and the triarylmethane-based compound includes a compound represented by one of the following Chemical Formulas 2-1 to 2-8, or a combination thereof:

[Chemical Formula 1-1]

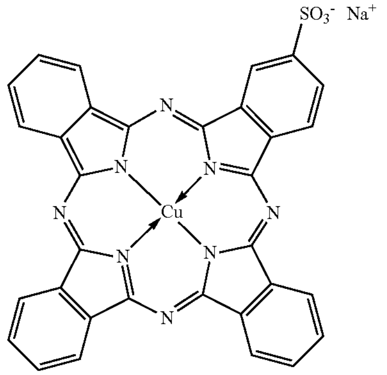

[Chemical Formula 1-2]

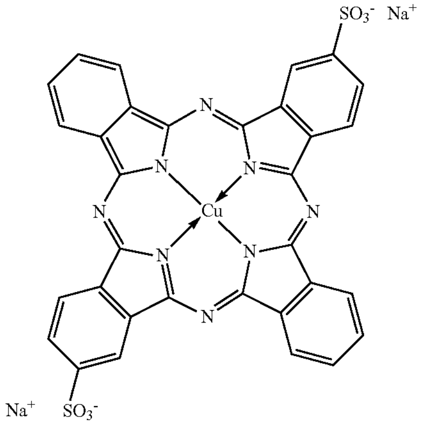

-continued

[Chemical Formula 1-3]

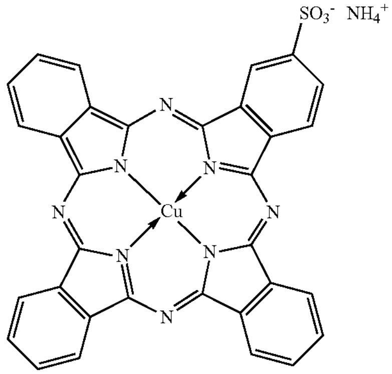

[Chemical Formula 1-4]

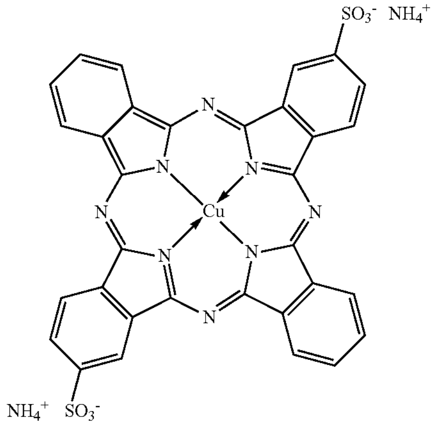

[Chemical Formula 2-1]

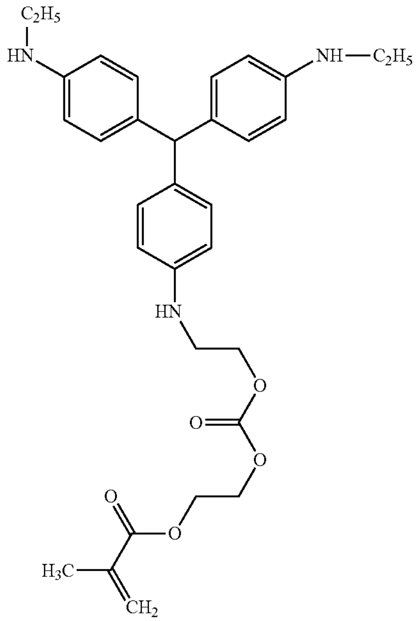

-continued
[Chemical Formula 2-2]
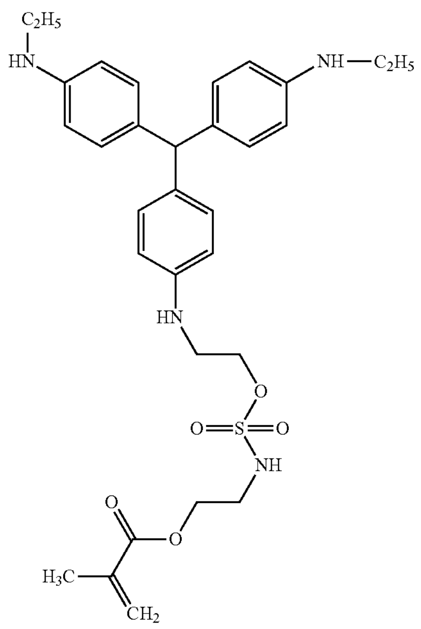
[Chemical Formula 2-3]
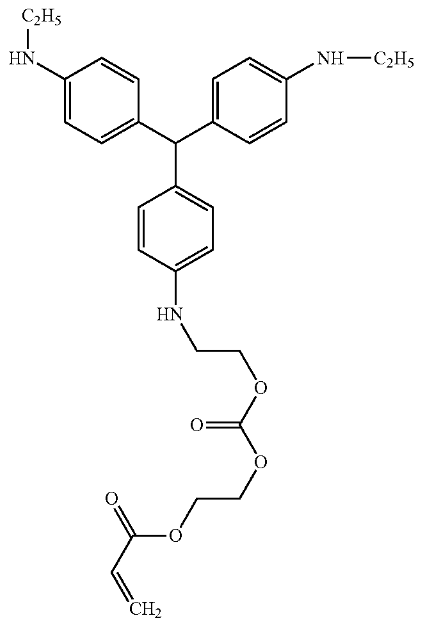
-continued
[Chemical Formula 2-4]
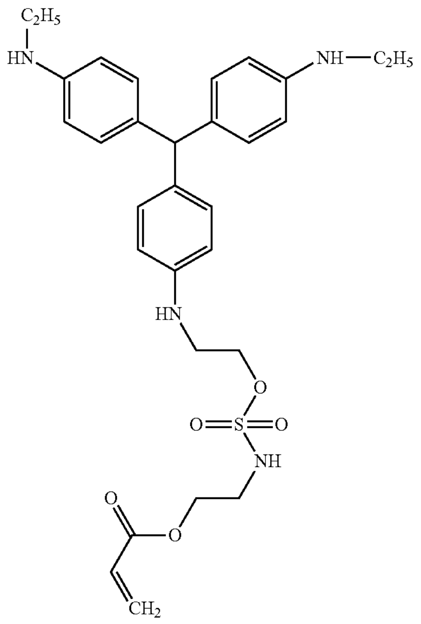
[Chemical Formula 2-5]
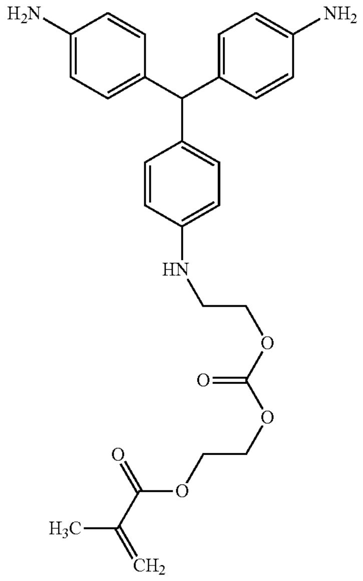

-continued

[Chemical Formula 2-6]

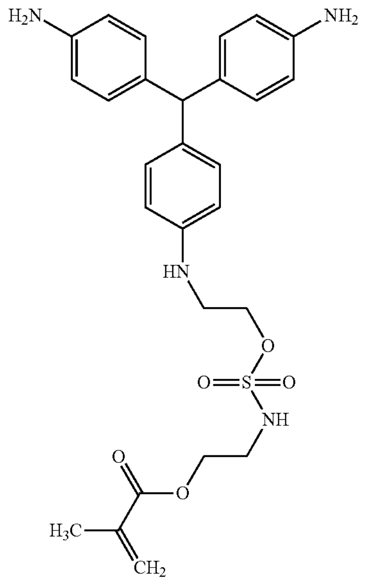

[Chemical Formula 2-7]

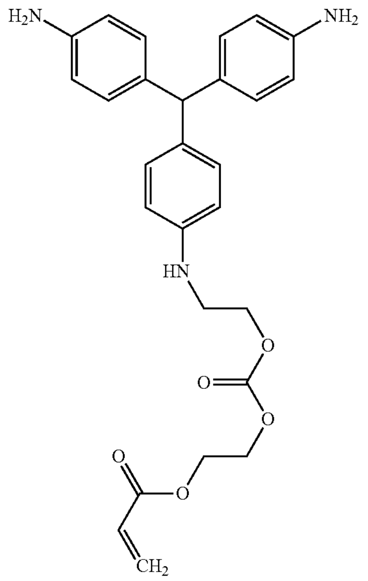

-continued

[Chemical Formula 2-8]

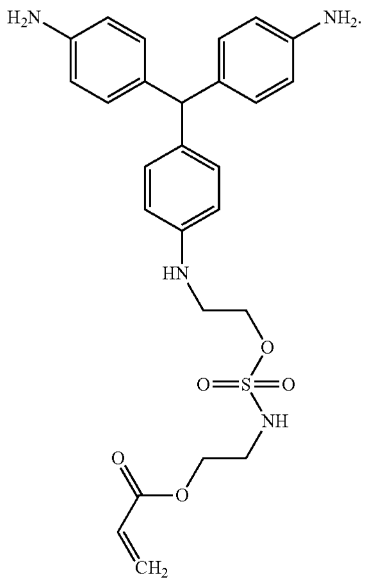

3. The photosensitive resin composition for a color filter of claim 1, wherein the colorant comprises the phthalocyanine-based compound and the triarylmethane-based compound at a weight ratio of about 1:1 to about 1:10.

4. The photosensitive resin composition for a color filter of claim 1, wherein the photosensitive resin composition for a color filter further comprises an alkali soluble resin, a photo-polymerizable monomer, a photopolymerization initiator, and a solvent.

5. The photosensitive resin composition for a color filter of claim 4, wherein the photosensitive resin composition for a color filter comprises about 1 to about 40 wt % of the colorant;

about 1 to about 30 wt % of the alkali soluble resin;

about 1 to about 20 wt % of the photopolymerizable monomer;

about 0.01 to about 10 wt % of the photopolymerization initiator; and balance of the solvent.

6. The photosensitive resin composition for a color filter of claim 1, wherein the photosensitive resin composition for a color filter further comprises an additive comprising malonic acid; 3-amino-1,2-propanediol; a silane-based coupling agent including a vinyl group or a (meth)acryloxy group; a leveling agent; a fluorine-based surfactant; a radical polymerization initiator; or a combination thereof.

7. A color filter prepared using the photosensitive resin composition for a color filter of claim 1.

* * * * *

UNITED STATES PATENT AND TRADEMARK OFFICE
CERTIFICATE OF CORRECTION

PATENT NO. : 8,758,966 B2
APPLICATION NO. : 13/609871
DATED : June 24, 2014
INVENTOR(S) : Sang-Won Cho et al.

It is certified that error appears in the above-identified patent and that said Letters Patent is hereby corrected as shown below:

In the Specification

Column 10, Line 48 reads: "~~$X_a^-$, $X_b^-$, $X_b^-$~~, and $X_d^-$ are the same or different and are" and should read: "$X_a^-$, $X_b^-$, $X_c^-$, and $X_d^-$ are the same or different and are"

Column 11, Line 15 reads: "k3+k42." and should read: "k3+k4 $\leq$ 2."

In the Claims

Claim 1, Column 30, Line 37 reads: "~~$Ar^1$ to $Ar^a$~~ are the same or different and are each indepen-" and should read: "$Ar^1$ to $Ar^3$ are the same or different and are each indepen-"

Signed and Sealed this
Twenty-first Day of October, 2014

Michelle K. Lee
*Deputy Director of the United States Patent and Trademark Office*